US012378690B2

(12) United States Patent
Chen et al.

(10) Patent No.: US 12,378,690 B2
(45) Date of Patent: Aug. 5, 2025

(54) METHOD FOR GROWING LONG-SEED DKDP CRYSTAL BY TWO-DIMENSIONAL MOTION

(71) Applicants: Shanghai Institute of Optics And Fine Mechanics, Chinese Academy of Sciences, Shanghai (CN); Chongqing University, Chongqing (CN)

(72) Inventors: Duanyang Chen, Shanghai (CN); Mingwei Li, Shanghai (CN); Hongji Qi, Shanghai (CN); Jianda Shao, Shanghai (CN); Bin Wang, Shanghai (CN); Hang Liu, Chongqing (CN); Huawei Yin, Chongqing (CN); Chuan Zhou, Chongqing (CN)

(73) Assignees: Shanghai Institute of Optics And Fine Mechanics, Chinese Academy of Sciences, Shanghai (CN); Chongqing University, Chongqing (CN)

( * ) Notice: Subject to any disclaimer, the term of this patent is extended or adjusted under 35 U.S.C. 154(b) by 250 days.

(21) Appl. No.: 18/189,054

(22) Filed: Mar. 23, 2023

(65) Prior Publication Data

US 2023/0227995 A1 Jul. 20, 2023

Related U.S. Application Data

(63) Continuation of application No. PCT/CN2021/111693, filed on Aug. 10, 2021.

(30) Foreign Application Priority Data

Mar. 30, 2021 (CN) .......................... 202110341818.X

(51) Int. Cl.
*C30B 7/00* (2006.01)
*C30B 29/16* (2006.01)

(52) U.S. Cl.
CPC ................ *C30B 7/00* (2013.01); *C30B 29/16* (2013.01)

(58) Field of Classification Search
CPC .............. C30B 7/00; C30B 29/16; C30B 7/08
See application file for complete search history.

(56) References Cited

U.S. PATENT DOCUMENTS

2004/0011278 A1  1/2004 Tatartchenko
2019/0135403 A1* 5/2019 Perry ..................... B64U 10/25
(Continued)

FOREIGN PATENT DOCUMENTS

CN     103361712 A   10/2013
JP     H10130087 A    5/1998

OTHER PUBLICATIONS

Cui, Qi-Dong et al., "Growth of KDP Crystal by '2-dimensional translational' Method," Journal of Synthetic Crystals, vol. 44, No. 6, pp. 1454-1459 (Jun. 2015).
(Continued)

*Primary Examiner* — Robert M Kunemund
(74) *Attorney, Agent, or Firm* — Mei & Mark LLP; Manni Li

(57) ABSTRACT

A method for growing long-seed DKDP crystal by two-dimensional motion grows the crystal along the cylindrical surface, and there is no cylinder-cone interface with low optical quality, while avoiding three flow regions which are inevitable in the crystal growth process by rotating crystal method, including incident flow, side flow and wake flow, and easily cause inclusion formation. The long seed crystal moves periodically in the fresh solution, four cylindrical surfaces can achieve reversible shear flow in one cycle, and any point on the cylindrical surface experiences the same hydrodynamic conditions in one movement cycle, so that the solute supply is sufficient and uniform, the growth velocity is improved, and the stability of morphology is ensured. The (Continued)

method facilitates rapid growth of high quality DKDP crystals and provides a better solution for the large-size, high-quality DKDP crystal growth required by the ICF laser device.

5 Claims, 2 Drawing Sheets

(56) References Cited

U.S. PATENT DOCUMENTS

| | | |
|---|---|---|
| 2019/0136403 A1 | 5/2019 | Qi et al. |
| 2019/0148003 A1* | 5/2019 | Van Hoe ................ G16H 15/00 705/3 |
| 2021/0348297 A1* | 11/2021 | Pintault ..................... C30B 7/00 |

OTHER PUBLICATIONS

Chen, Duanyang et al., "Rapid growth of a long-seed KDP crystal," High Power Laser Science and Engineering, , vol. 8, e6, 5 pages (2020).

* cited by examiner

METHOD FOR GROWING LONG-SEED DKDP CRYSTAL BY TWO-DIMENSIONAL MOTION

CROSS-REFERENCE TO RELATED APPLICATIONS

The subject application is a continuation of PCT/CN2021/111693 filed on Aug. 10, 2021, which in turn claims priority on Chinese Patent Application No. 202110341818.X filed on Mar. 30, 2021. The contents and subject matters of the PCT international stage application and Chinese priority application are incorporated herein by reference.

TECHNICAL FIELD

The present invention is in the field of artificial crystal growth and relates to a method for growing a DKDP crystal, and particularly, a method for rapidly growing a high-quality DKDP crystal by the means of two-dimensional motion.

BACKGROUND ART

Large aperture DKDP crystals are the only mixing elements available in inertial confinement fusion ICF devices due to their function in the efficient suppression of transverse stimulated Raman scattering. DKDP crystals have been grown mainly by the traditional slow growth method and point seed crystal omni-directional rapid growth method. The traditional slow growth method uses a plate-like seed crystal to grow along the [001] direction and not grow along the [100] direction in a growth solution with low supersaturation, and the resulting crystals are all cone regions with cone surface growth, but the growth velocity is slow and the growth period is long. The point seed crystal omni-directional rapid growth method uses the point seed crystal to grow along the [100] and [001] directions in the growth solution with high supersaturation, and the resulting crystal contains the cylinder region grown from the cylindrical surface and the cone region grown from the cone surface, so the interface between the cylinder region and the cone region in the crystal forms the cylinder-cone interface, and the crystal quality of the part is poor, which is a short plate restricting the overall quality of the crystal. The long-seed growth method is a new method in the field of DKDP crystal growth that maintains a high growth velocity of the rapid growth method, and by increasing the height of the seed crystal and cutting the frequency-tripled elements in the cylindrical region corresponding to the long seed crystal, the method completely eliminates the cone-cylinder interface problems inherent in the fast growth of the point seed crystal. For details, please refer to the papers published by D. CHEN et al., "Rapid growth of a long-seed KDP crystal," Journal of High Power Laser Science, 2020.8.

However, DKDP crystal growth has long been performed by the rotating crystal method, i.e., the crystal is grown on a crystal carrying frame or tray around a center of rotation. Because the DKDP crystal is a regular quadrangular prism plus quadrangular pyramid, there are three flow regions which are inevitable in the process of rotational growth including the incident flow, side flow, and wake flow. At the same time, the different linear velocities of the edge of the crystal and the center of the crystal plane lead to different shear stress and boundary layer thickness at different positions of the crystal surface. The non-uniformity of hydrodynamics on the crystal surface will lead to the non-uniformity of microscopic solute transport in the crystal growth, which is unfavorable for the growth of DKDP crystals with high optical uniformity. Especially, when the crystal size is relatively large, the non-uniform solute transport on the crystal surface may cause macro-defects such as white lines, seeding and spot cracking, and even lead to failure of crystal growth. Therefore, it is necessary to innovatively propose a new DKDP crystal growing method to solve the defects of the non-uniform hydrodynamics in the rotating crystal method.

SUMMARY OF THE INVENTION

To overcome the problems with the existing long-seed DKDP crystal growth method, the present invention provides a method for growing long-seed DKDP crystal based on two-dimensional motion. This method is beneficial to the rapid growth of high quality DKDP crystals, and provides a better solution for the large-size, high-quality DKDP crystal growth required by the ICF laser device.

The technical solution of the present invention is as follows:

A method for growing long-seed DKDP crystal by two-dimensional motion, comprising the steps of mounting a two-dimensional motion motor on an upper part of a growth tank, and connecting a lower end of the two-dimensional motion motor to a connecting rod of a crystal carrying frame; during the growth process of a long-seed DKDP crystal, driving the crystal carrying frame to periodically translating on a horizontal plane according to a square motion track in a growth solution in the growth tank by the two-dimensional motion motor until the growth of the crystal ends.

The single side of the square movement of the crystal carrying frame periodically translated on a horizontal plane according to the square motion track adopts a motion mode of "performing uniformly accelerated linear motion at an acceleration a from 0—maintaining a uniform linear motion after the velocity reaches V—performing uniformly decelerated linear motion at an acceleration a until the velocity decreases to 0" on all four sides. The single side length of the square motion is in the range of 50 to 500 mm, the acceleration a of the uniformly accelerated linear motion is in the range of 0.01 to 1 m/s$^2$, the velocity V of the uniformly decelerated linear motion is in the range of 0.01 to 1 m/s, and the cross section of the growth tank is square.

The technical effects of the present invention are as follows.

Firstly, the long-seed DKDP crystals grow along the cylindrical surface, and there is no cylinder-cone interface with low optical quality. Secondly, the method of the present invention avoids the three flow regions which are inevitable in the crystal growth process by rotating crystal method including the incident flow, side flow, and wake flow, and easily cause inclusion formation. The long seed crystal moves periodically in the fresh solution, the four cylindrical surfaces achieve reversible shear flow in one cycle, and any point on the cylindrical surface experiences the same hydrodynamic conditions in one movement cycle so that the solute supply is sufficient and uniform, the growth velocity is improved, and the stability of morphology is ensured. The method of the present invention is beneficial to the rapid growth of high quality DKDP crystals and provides a better solution for the large-size, high-quality DKDP crystal growth required by the ICF laser device.

DETAILED DESCRIPTION OF THE INVENTION

The present invention is described in further details in the examples and with reference to the drawings, which are not intended to limit the scope of protection for the present invention.

Example 1

Figure 1:
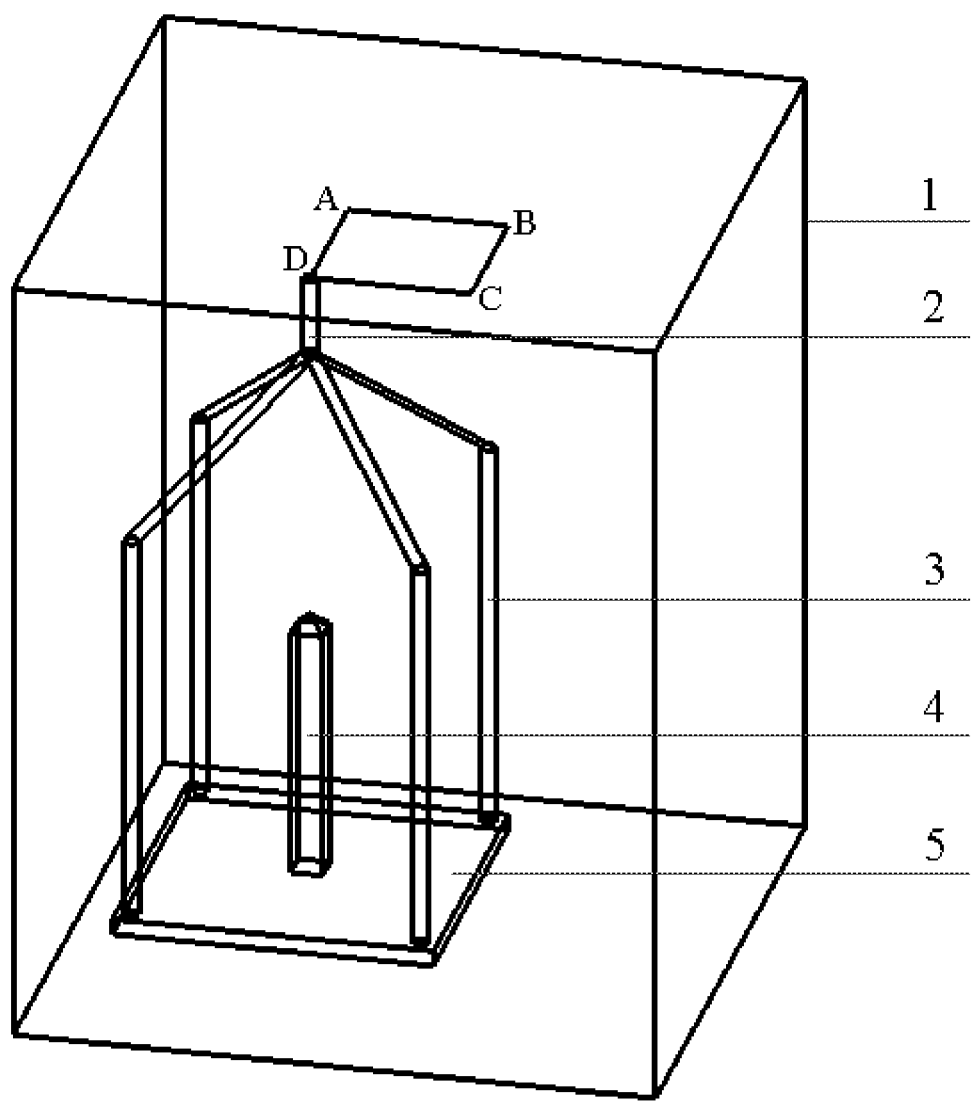
FIG. 1 is a schematic view of a growing device for the method for growing long-seed DKDP crystal by two-dimensional motion according to the present invention, wherein: 1—growth tank; 2—crystal carrying frame connecting rod; 3—crystal carrying frame side bars; 4—long seed; 5—crystal carrying frame tray.

As shown in FIG. 1, the method for growing long-seed DKDP crystal by two-dimensional motion in the present invention comprises mounting a two-dimensional motion motor on an upper part of a growth tank, and a lower end of the two-dimensional motion motor is connected to a connecting rod of a crystal carrying frame; during the growth process of a long-seed DKDP crystal, driving the crystal carrying frame to periodically translating along a motion track of "A-B-C-D" on a horizontal plane according to a square motion track in a growth solution in the growth tank by the two-dimensional motion motor until the growth of the crystal ends.

The single side of the square movement of the crystal carrying frame periodically translated on a horizontal plane according to the square motion track adopts a mode of "a single side length of 50 mm, an acceleration a=0.01 m/s$^2$, and a constant velocity V=0.01 m/s", and the cross section of the growth tank is square.

Example 2

As shown in FIG. 1, the method for growing long-seed DKDP crystal by two-dimensional motion of the present invention comprises mounting a two-dimensional motion motor on an upper part of a growth tank, and a lower end of the two-dimensional motion motor is connected to a connecting rod of a crystal carrying frame; during the growth process of a long-seed DKDP crystal, driving the crystal carrying frame to periodically translating along a motion track of "A-D-C-B" on a horizontal plane according to a square motion track in a growth solution in the growth tank by the two-dimensional motion motor until the growth of the crystal ends.

The single side of the square movement of the crystal carrying frame periodically translated on a horizontal plane according to the square motion track adopts a mode of "a single side length of 500 mm, an acceleration a=1 m/s$^2$, and a constant velocity V=1 m/s", and the cross section of the growth tank is square.

Example 3

As shown in FIG. 1, the method for growing long-seed DKDP crystal by two-dimensional motion comprises mounting a two-dimensional motion motor on an upper part of a growth tank, and a lower end of the two-dimensional motion motor is connected to a connecting rod of a crystal carrying frame; during the growth process of a long-seed DKDP crystal, driving the crystal carrying frame to periodically translating along a motion track of "A-B-C-D" on a horizontal plane according to a square motion track in a growth solution in the growth tank by the two-dimensional motion motor until the growth of the crystal ends.

The single side of the square movement of the crystal carrying frame periodically translated on a horizontal plane according to the square motion track adopts a mode of "a single side length of 500 mm, an acceleration a=0.01 m/s$^2$, and a constant velocity V=0.1 m/s", and the cross section of the growth tank is square.

Figure 2:
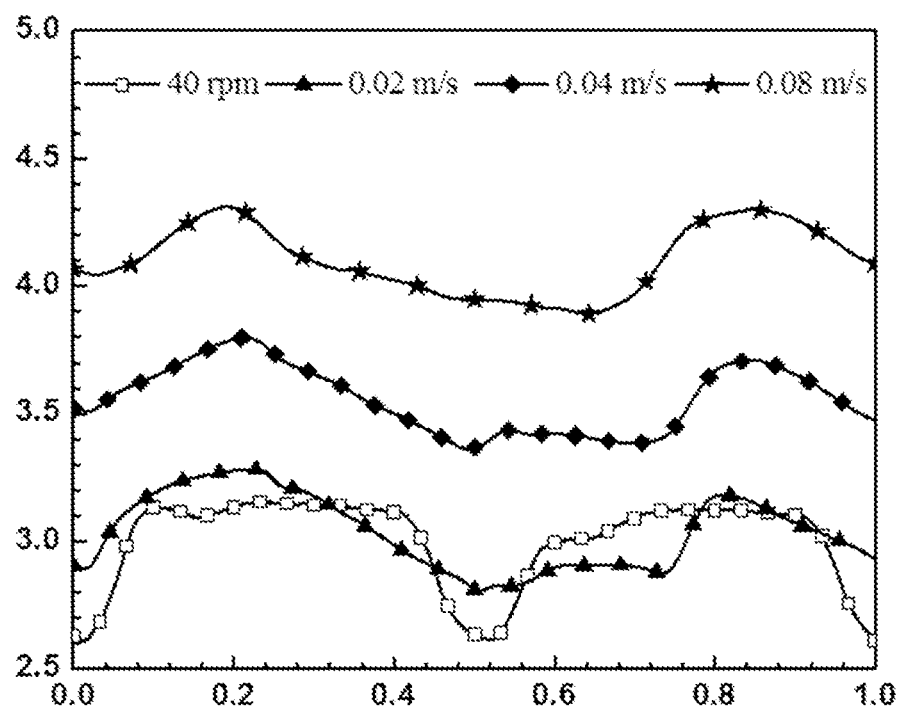
FIG. 2 shows the comparison of the rotating crystal method and the method for growing long-seed DKDP crystal based on the two-dimensional motion of the present invention in the trend numerical simulation results for the average supersaturation value of the cylindrical surface over time over one period of motion when growing a long-seeded DKDP crystal. The horizontal axis (x) represents normalized time in motion period, and the vertical axis (y) represents the average supersaturation value of cylindrical surface (%).
Figure 3:
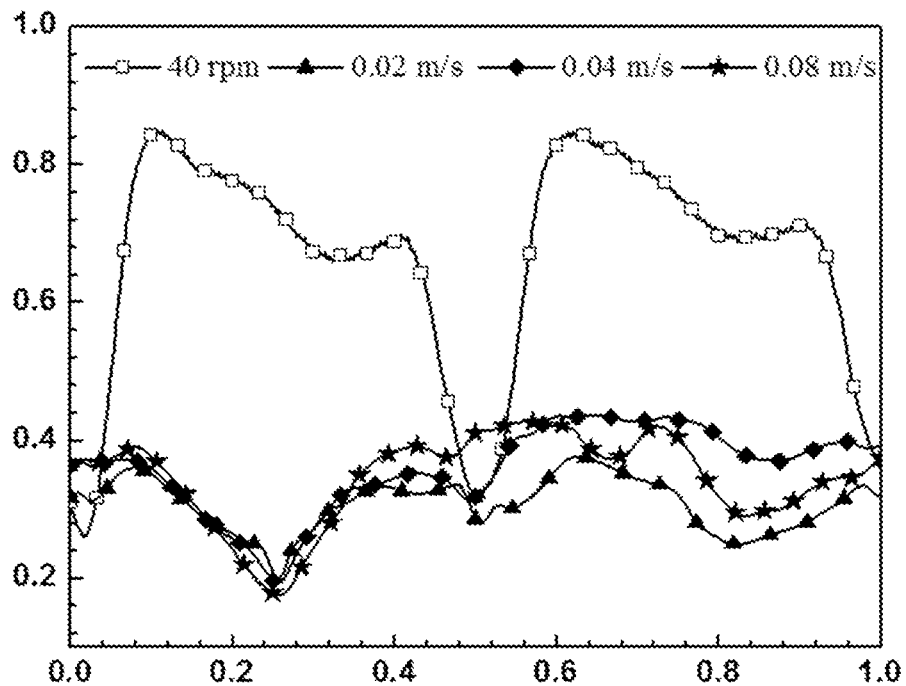
FIG. 3 shows the comparison of the rotating crystal method and the method for growing long-seed DKDP crystal based on the two-dimensional motion of the present invention in the trend numerical simulation results for the supersaturation standard deviation of the cylindrical surface over time over one period of motion when growing a long-seeded DKDP crystal. The horizontal axis (x) represents normalized time in motion period, and the vertical axis (y) represents the supersaturation standard deviation of cylindrical surface (%).

FIGS. 2 and 3 show the numerical simulation results comparing the trend of the average supersaturation value and standard deviation of cylindrical surface over time over one period of motion when growing a long-seeded DKDP crystal according to the rotating crystal method and the method for growing long-seed DKDP crystal based on the two-dimensional motion of the present invention. Where the supersaturation degree of the solution is maintained at 5%, the crystal size is 10 mm×10 mm×100 mm (length×width× height) and the cone height is 5 mm. The maximum rotation speed of the rotating crystal method is 40 rpm, and 1 min rotation period of "4 s acceleration −20 s uniform −4 s deceleration −2 s static −4 s reverse acceleration −20 s uniform −4 s deceleration −2 s static" is adopted; the mode of "single side length 100 mm, acceleration a=0.04 m/s$^2$, uniform velocity V=0.02 m/s" is used for the single side of two dimensional motion of 0.02 m/s, the mode of "single side length 100 mm, acceleration a=0.08 m/s$^2$, uniform velocity V=0.04 m/s" is used for the single side of two dimensional motion of 0.04 m/s, the mode of "single side length 100 mm, acceleration a=0.16 m/s$^2$, uniform velocity V=0.08 m/s" is used for the single side of two dimensional motion of 0.08 m/s.

In the growth process of DKDP crystal, the average supersaturation value of crystal surface reflects the growth velocity of crystal, the larger the average supersaturation value of crystal surface is, the faster the growth velocity of crystal is; the standard deviation of supersaturation reflects the uniformity of supersaturation distribution. The smaller the standard deviation, the better the stability of crystal surface morphology and the higher the quality of grown crystal.

It can be seen from FIG. 2 that even in the mode with a uniform speed of only 0.02 m/s, the average supersaturation value of the crystal cylindrical surface grown by the two-dimensional motion method has reached the level of the maximum rotation speed of 40 rpm of the rotating crystal method, indicating that the two-dimensional motion growth method has a significant advantage in terms of growth velocity, which can easily exceed the growth velocity of the DKDP crystal grown by the rotating crystal method.

It can be seen from FIG. 3 that the standard deviations of the supersaturation of the crystal cylindrical surface grown by the two-dimensional motion method are all relatively low, and are significantly lower than the standard deviation of the supersaturation of the crystal cylindrical surface grown by the rotation method at the maximum rotation speed of 40 rpm, indicating that the crystals grown by the two-dimensional motion growth method have obvious advantages in crystal quality, and are better than the crystals grown by the rotating crystal method.

We claim:

1. A method for growing a long-seed DKDP crystal by two-dimensional motion, comprising:
    mounting a two-dimensional motion motor on an upper part of a growth tank and connecting a lower end of the two-dimensional motion motor to a connecting rod of a crystal carrying frame,
    placing a long-seed DKDP crystal on the crystal carrying frame,
    driving the crystal carrying frame with the long-seed DKDP crystal to periodically translating on a horizontal plane according to a square motion track in a growth solution in the growth tank by the two-dimensional motion motor in a motion mode, and
    growing the long-seed DKDP crystal along all cylindrical surfaces in the growth tank to obtain a DKDP crystal with no quality restriction of a cylinder-cone interface until growth of the long-seed DKDP crystal ends,
    wherein the motion mode is performing uniformly accelerated linear motion at an acceleration velocity a from 0—maintaining a uniform linear motion after a velocity reaches V—performing uniformly decelerated linear motion at an acceleration a until the velocity decreases to 0 on all four sides of the square motion track,
    the accelerated velocity a of the uniformly accelerated linear motion is in a range of 0.01 to 1 $m/s^2$, and the velocity V of the maintained uniformly linear motion is in a range of 0.01 to 1 m/s.

2. The method of claim 1, wherein a length of each single side of the square motion track is in 50 mm, the accelerated velocity a of the uniformly accelerated linear motion is 0.01 $m/s^2$, and the velocity V of the maintained uniformly linear motion is 0.01 m/s.

3. The method of claim 1, wherein a length of each single side of the square motion track is 500 mm, the accelerated velocity a of the uniformly accelerated linear motion is 1 $m/s^2$, and the velocity V of the maintained uniformly linear motion is 1 m/s.

4. The method of claim 1, wherein a length of each single side of the square motion track in 500 mm, the accelerated velocity a of the uniformly accelerated linear motion is 0.01 $m/s^2$, and the velocity V of the uniformly maintained linear motion is 0.1 m/s.

5. The method of claim 1, wherein a cross-section of the growth tank is square.

* * * * *